(12) United States Patent
Nair et al.

(10) Patent No.: US 6,466,473 B2
(45) Date of Patent: Oct. 15, 2002

(54) METHOD AND APPARATUS FOR INCREASING SIGNAL TO SNEAK RATIO IN POLARIZABLE CROSS-POINT MATRIX MEMORY ARRAYS

(75) Inventors: Rajendran Nair, Hillsboro, OR (US); David G. Chow, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,690

(22) Filed: Mar. 30, 2001

(65) Prior Publication Data

US 2002/0141222 A1 Oct. 3, 2002

(51) Int. Cl.[7] .............................................. G11C 11/22
(52) U.S. Cl. .................................. 365/145; 365/230.01
(58) Field of Search ............................. 365/145, 230.01

(56) References Cited

U.S. PATENT DOCUMENTS

| | | | |
|---|---|---|---|
| 5,363,325 A | * 11/1994 | Sunouchi et al. | 365/149 |
| 5,400,275 A | 3/1995 | Abe et al. | 365/145 |
| 5,615,144 A | * 3/1997 | Kimura et al. | 365/145 |
| 6,147,896 A | 11/2000 | Kim et al. | 365/145 |

FOREIGN PATENT DOCUMENTS

JP            0183092     *  8/1987     ........... G11C/11/22

OTHER PUBLICATIONS

Betty Prince, "Semiconductor Memories", 1983, Wiley, 2nd edition, pp. 654–655.*

* cited by examiner

Primary Examiner—M. Tran
(74) Attorney, Agent, or Firm—Blakely, Sokoloff, Taylor & Zafman LLP

(57) ABSTRACT

A state of a memory element in a memory device is accessed by conditioning a number of wordlines and an addressed one of a number of bitlines in the memory device. This causes an addressed one of the memory elements in the device to release a signal charge and an unaddressed one to release a sneak charge into the addressed bitline. This charge release causes the current in the addressed bitline to increase. This current is integrated, and integration is halted when a signal to sneak ratio of the addressed bitline is maximized. The integration yields a total bitline charge value that may be used to obtain a more accurate measurement of the released signal charge.

22 Claims, 5 Drawing Sheets

METHOD AND APPARATUS FOR INCREASING SIGNAL TO SNEAK RATIO IN POLARIZABLE CROSS-POINT MATRIX MEMORY ARRAYS

BACKGROUND

This invention is generally related to solid state memory arrays in which the memory elements have a polarizable material such as a dipole ferroelectric material, and more particularly related to reading stored information from such arrays with increased signal to sneak ratio.

Applications of cross-point solid state memory arrays with polarizable materials include non-volatile cache memory inside a hard disk drive and perhaps even a replacement to the hard disk drive. That's because such memory arrays provide very high density storage of binary information and fast access speeds. In such devices, binary information (a combination of "1"s and "0"s) may be stored in an array of polarizable memory elements, where each element has at least two possible states that represent one bit ("1" or "0") of stored information. In a switched dipole memory array, each element has a dipole that can retain a written electric or magnetic state after power has been turned off. These non-volatile elements retain the written state until rewritten by an externally imposed electric or magnetic field that switches the state of the element.

The voltage vs. charge behavior of a dipole element, as measured across a pair of the element's terminals, exhibits hysteresis as shown in FIG. 1. The hysteresis allows the element to exhibit any one of two different states of charge (labeled A and B) when the voltage is at a 'static' level, here zero volts, depending upon the last write operation. To write A, the terminal voltage is increased above an upper polarization voltage, Vh; this causes the resulting state to either remain at A or change from B to A. Conversely, to write B, the terminal voltage is decreased below a lower polarization voltage Vl; this causes the resulting state to either remain at B or change from A to B. The state is retained by keeping the terminal voltage at the static level. Note that some variation in the terminal voltage around the static level may be tolerated without changing the state of the element. This variation in terminal voltage is sometimes called a 'half-read'.

To actually read an existing state of an element, the following procedure may be performed. First, B is written to the element. If a charge is released (either positive or negative), which signifies that the write resulted in a change of state, then the preexisting state must have been A. On the other hand, if no essentially no charge is released, which signifies that the write did not cause a change of state, then the preexisting state must have been B. Of course, if the preexisting state was A, then the state should be changed back to A following the write of B.

To access the elements for reading and writing, a cross-point matrix of conductive lines is formed around the elements, where each element 202 (i,j) is associated with a respective crossing of a pair of vertical and horizontal lines, as seen in FIG. 2. The vertical lines 204_1, 204_2, . . . 204_N (204) in this example are known as bitlines, while the horizontal lines 208_1, 208_2, . . . 208_M (208) are called wordlines. To read element(1,1), the voltage between wordline 1 and bitline 1 needs to be changed from its static level to the polarization level, and then the charge released on bitline 1 by element (1,1), known as a 'signal' charge, needs to be measured.

A problem, however, with measuring an addressed element's signal charge is that since all other elements in the same column as the addressed element are electrically connected to the same bitline, there is a significant 'sneak' charge that is released by the other elements while attempting to read the addressed element. This sneak charge can be orders of magnitude larger than the signal charge when the memory array is large.

Typically, an element access operation has two phases. During a bitline settling phase, the addressed bitline, the addressed wordline, and all other wordlines of the array (these are referred to as being 'unaddressed') are forced to intermediate voltages (less than the polarization voltage) which cause an amount of sneak charge to be released. In a subsequent signal integration phase, the addressed bitline and wordline are driven to the polarization voltage which causes an amount of signal charge (typically much smaller than the total amount of sneak charge) to be released and integrated. There are two limited solutions that allow the signal to be distinguished from the sneak. In the first case, the bitline settling phase is extended to allow a change in the bitline current, which is essentially caused by induced sneak charge during this phase, to dissipate prior to starting integration of the bitline current. Upon halting integration, this yields a value for total bitline charge including the signal charge. A value representing an estimate of the amount of sneak charge only (without any signal charge contribution) is then subtracted from the total bitline charge, to obtain a net bitline charge which represents only the signal charge induced during the integration interval. In the second solution, the integration phase is extended to allow more signal charge to contribute to the total bitline charge. Although both of these solutions attempt to increase the measured signal to sneak ratio in the integration phase, they lead to increased delays in accessing an element in the memory array which severely restricts the access speed.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

According to an embodiment of the invention, integration of a bitline current is halted at a point in time which results in a maximum signal to sneak ratio for the bitline. For instance, this may occur if the integration is stopped as soon as a rate of decrease of the current has been substantially reduced. The integration of the bitline current yields a total bitline charge value whose sneak component may be estimated and then subtracted, to yield the signal component. By using a shortened integration time, the various embodiments of the invention help increase the signal to sneak ratio in the total bitline charge value obtained by the integration. As such, the measured signal component is more accurate. In addition, another advantage of shortening the integration time is faster access of a memory element in the array.

Figure 2:
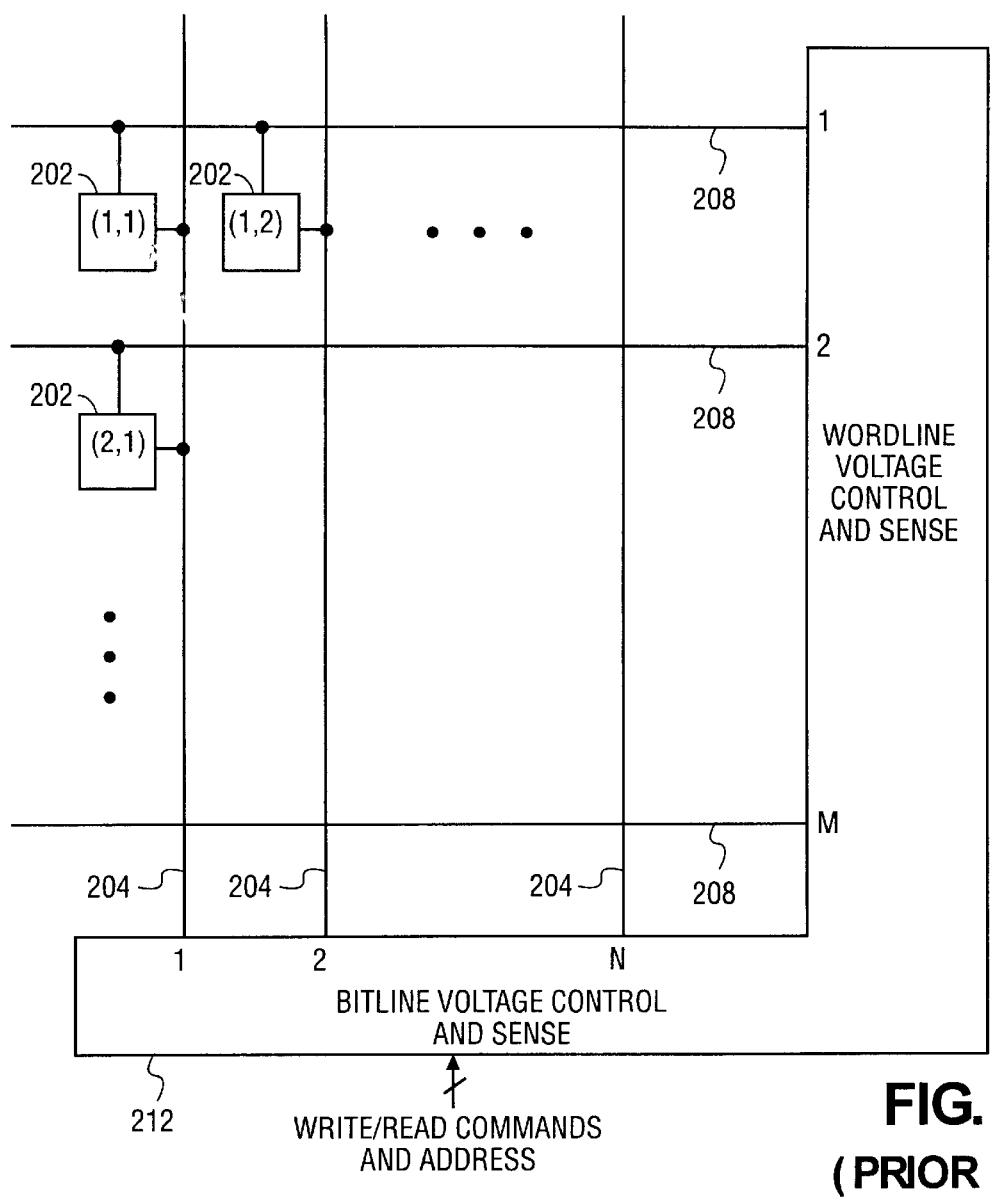
FIG. 2 shows a block diagram of a conventional polarizable material cross-point matrix memory array.
Figure 1:
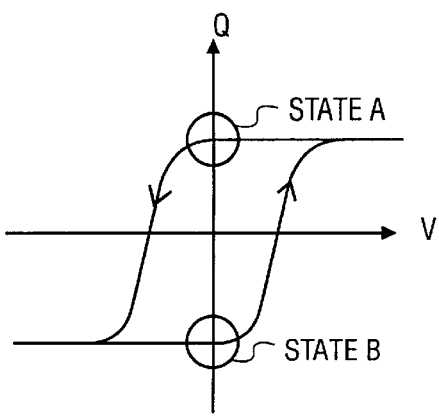
FIG. 1 illustrates a charge-voltage plot of a memory element containing a polarizable material.
Figure 3:
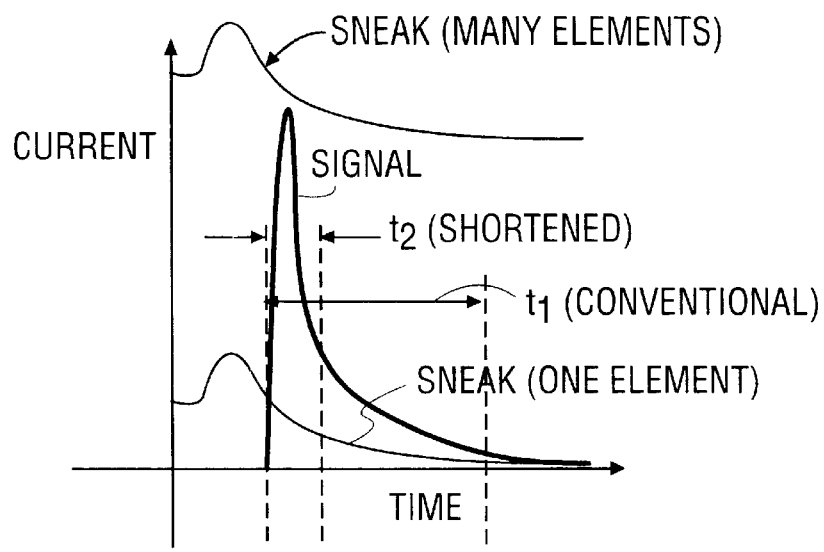
FIG. 3 illustrates a plot of signal and sneak currents (versus time) which are introduced into a bitline of a memory array, as well as an exemplary integration interval according to an embodiment of the invention.

Referring now to FIG. 3, the effect of the shortened integration interval t2 is shown by a plot of current versus time for signal and sneak. This plot (though not to scale) shows the sneak currents that may be contributed by a single unaddressed element and by many unaddressed elements into a bitline. It also shows the signal current that is introduced into the bitline by the addressed element. Note how the signal current decreases much faster than the sneak current. Recognizing this, shortening the integration interval t2 allows a greater ratio of integrated signal current to sneak current to be obtained, as compared to the relatively long conventional integration interval t1. Even the smallest improvement in signal to sneak ratio is beneficial to the proper readout of a polarizable material cross-point matrix memory array, because the array in actuality causes a sneak current by many elements that are connected to the same addressed bitline, such that the actual sneak current may be several orders of magnitude larger than the signal current. Thus, to detect the total signal charge in a reliable manner, the ratio of the measured signal charge to the measured sneak charge on an addressed bitline should be optimized.

Another way to determine the optimal point in time at which integration should be halted, so as to optimize the signal to sneak ratio, may be to stop integration as soon as a rate of change of a running total bitline charge value has been substantially reduced. This criteria for halting the integration time may be illustrated using the plot of FIG. 4 which shows the total charge for signal and sneak as a function of time. In this plot, the effect of shortening the integration time from t1 to t2 on the signal to sneak ratio is more readily visible. Note how the plot of the total signal charge flattens out after the end of t2. This means that integration beyond t2 does not significantly increase the total signal charge.

Sometimes, the highest signal to sneak ratio may not be desirable if it would unnecessarily extend the integration interval. For instance, if the speed of accessing the array is the most important consideration, then the integration time should be further reduced, until the signal to sneak ratio has dropped to its lowest acceptable level. On the other hand, if maximum signal to sneak ratio is desired due to a noisy environment or excessive sneak charge, then the integration time should be reduced only until the maximum signal to sneak has been obtained. In general, the integration time should be selected in view of the signal to sneak ratio that is available for such a selection, and in view of factors such as the desired speed for accessing an element, the size of the memory array, and the type of memory elements used.

Figure 4:
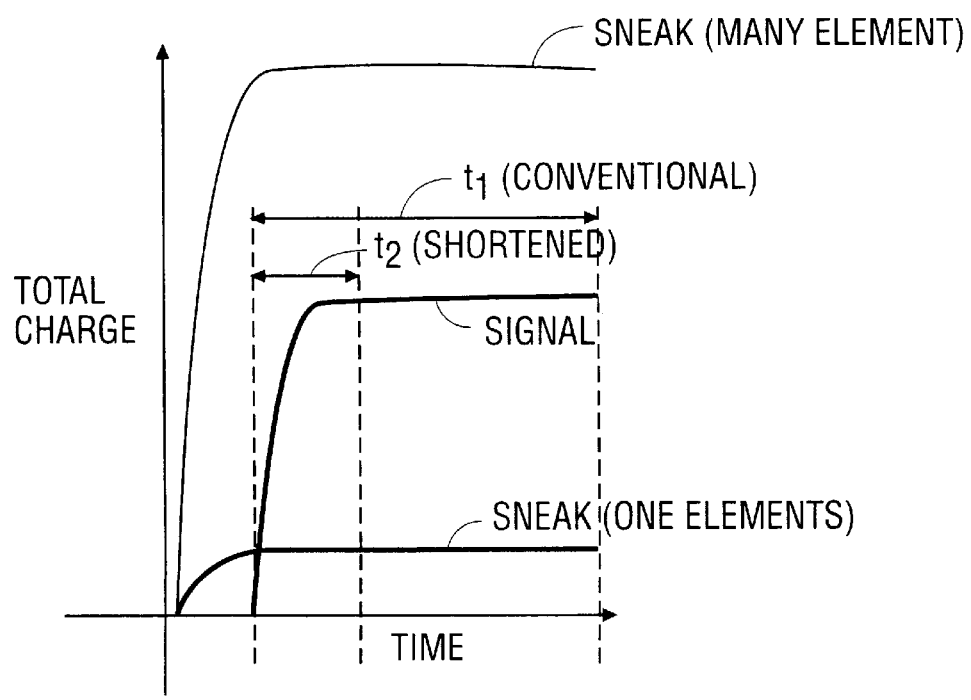
FIG. 4 depicts a plot of total charge for signal and sneak (versus time) introduced into a bitline of the memory array, and that also indicates differences between conventional integration intervals and an integration interval that has been shortened according to an embodiment of the invention.

It should be noted that when the signal to sneak ratio is maximized, the integration time that yields such a maximum ratio will be substantially less than the relatively long, conventional interval t1 shown in FIGS. 3 and 4. The range of shortened integration times for optimizing access speed and signal to sneak ratio may be close to the intervals obtained by stopping the integration as soon as a rate of decrease of the bitline current has been substantially reduced or as soon as a rate of change of a running total bitline charge value has been substantially reduced.

Figure 5:
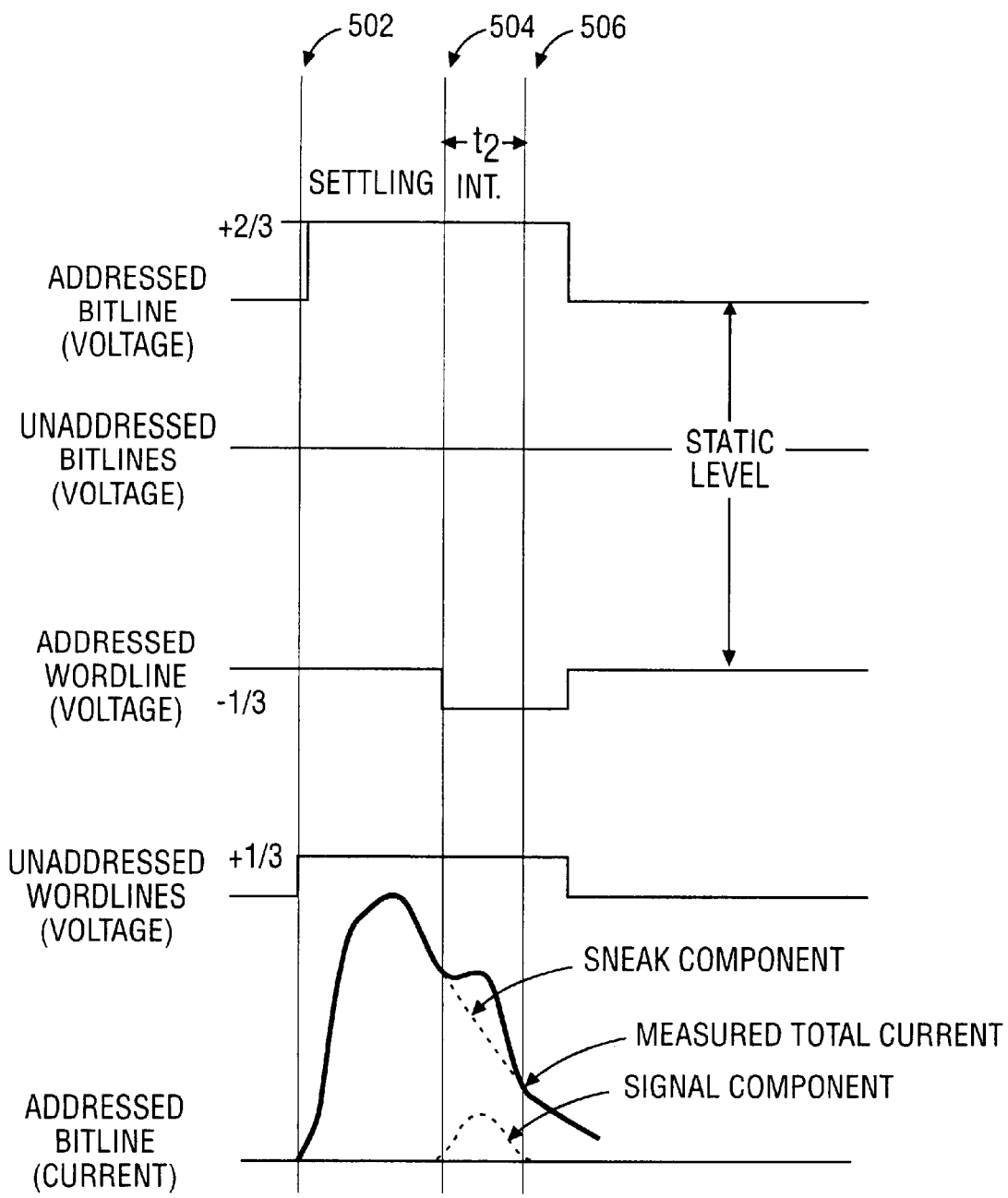
FIG. 5 depicts a number of waveforms (versus time) of bitline and wordline voltages as well as the current in an addressed bitline, of a polarizable material cross-point matrix memory array.

Referring now to FIG. 5, waveforms for bitline and wordline voltages and addressed bitline currents, as a function of time, are shown for an exemplary method of accessing a state of a memory element in a memory device that features a polarizable material cross-point matrix memory array. The voltage conditioning of wordlines and bitlines causes an addressed one of the memory elements in the device to release a signal charge and an unaddressed one to release a sneak charge into an addressed bitline. This release of signal and sneak charge causes a bitline current in the address line to increase as shown in the bottom waveform of FIG. 5. It may be assumed that when the bitlines and wordlines are at their static level, relatively negligible amounts of sneak charge are introduced into a bitline. Thus, beginning with time 502, the current in the addressed bitline (being essentially sneak current at this point in time) starts to increase in response to the addressed bitline voltage being increased to $\frac{2}{3}$ the magnitude of the polarization voltage (Vh or Vl as the case may be). At essentially the same time 502, the voltage on the unaddressed wordlines is moved up to $\frac{1}{3}$ of the polarization voltage. This slight increase in the voltage on the unaddressed wordlines helps limit the amount of sneak charge that is introduced into the addressed bitline (as compared to leaving the unaddressed wordlines at the static voltage level). Meanwhile, the unaddressed bitlines are kept at the static level. Thus, starting at time 502, the increase in sneak charge leads to a sharp increase in sneak current as shown in the bottom waveform. This sneak current, however, peaks and begins to drop before the end of the bitline settling phase (or interval) at time 504.

At time 504, which in this embodiment is the start of the integration interval (t2), the full polarization voltage is applied between the addressed bitline and the addressed wordline. In this example, the full polarization voltage is obtained by lowering the addressed wordline voltage below the static level, by an amount essentially equal to $\frac{1}{3}$ of the magnitude of the polarization voltage. Thus, with the addressed bitline voltage being at $\frac{2}{3}$ of the polarization voltage above the static level, the memory element which is connected to the addressed bitline and addressed wordline receives the full polarization voltage. Assuming that this application of the polarization voltage causes a change of state in the memory element, this memory element releases its signal charge which causes an upward protrusion in the measured total current as shown in the bottom waveform of FIG. 5. In effect, the measured total current during the integration interval t2 includes an initially increasing signal component and a much larger, but decreasing, sneak component as shown.

To obtain the measured signal charge released during the integration interval t2, a value that represents an estimate of the amount of sneak charge (from the sneak current component) that has been released in the bitline is subtracted from the total bitline charge value that is obtained at time 506, the end of the integration interval t2. The measured signal charge is then compared to a threshold charge value to determine whether the amount of measured signal charge is sufficient to indicate a change in state of the memory element. It should be noted that if the measured signal charge indicates that there was a change in state in the addressed memory element, then the addressed memory element should be returned to its preexisting state by a "write" operation that applies the opposite polarization voltage to the addressed bitline and addressed wordline. After the end of the integration interval at time 506, the addressed bitline and wordlines as well as the unaddressed wordlines may be brought back to their static levels.

Figure 6:
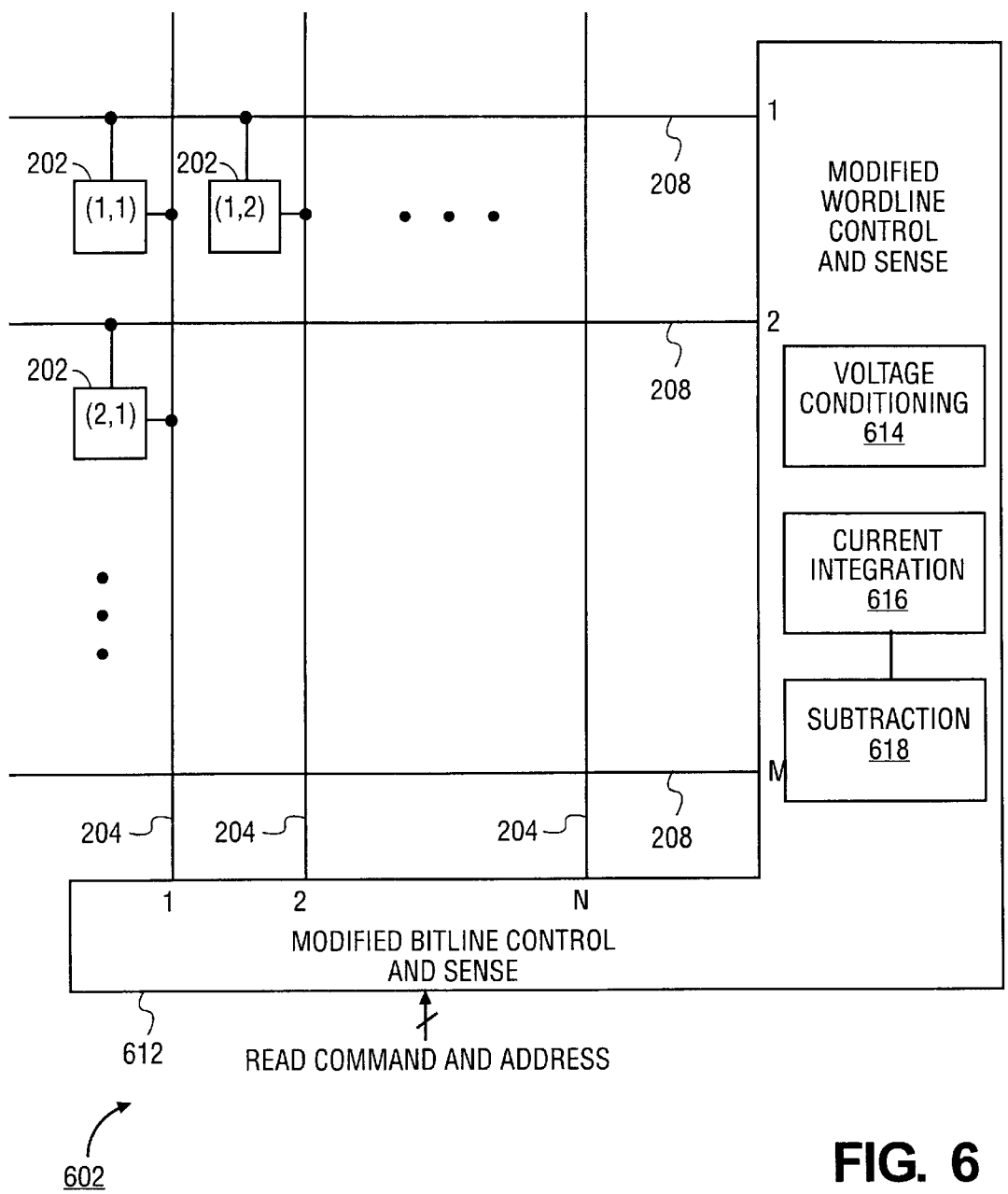
FIG. 6 illustrates a block diagram of a non-volatile polarizable memory device featuring modified wordline and bitline control and sense circuitry.

Turning now to FIG. 6, what's shown is a block diagram of a memory device 602 according to an embodiment of the invention. The device 602 features a number of memory elements 202 that are physically arranged in rows and columns of an array. Each element 202 contains a polarizable material. The polarizable material allows the memory element 202 to have at least two stable states that can be detected and altered by voltage and/or current conditioning of the memory element 202 via its two terminals. Each memory element is connected to a bitline 204 and a wordline 208. The array features N bitlines and M wordlines that are arranged in a cross-point matrix as shown. This matrix provides access to the individual memory elements 202. When a memory element 202, for instance element (1,1), is being addressed, it will release a signal charge into bitline 204_1. In addition, while the addressed memory element is being read, an unaddressed memory element, such as memory element (2,1), will release a sneak charge into the addressed bitline 204_1. An exemplary technique for reading a memory element was described above in connection with FIGS. 3–5.

The memory device 602 further includes modified bitline and wordline control and sense circuitry 612. This circuitry is responsible for controlling the voltages that are applied to the bitlines and wordlines while an addressed memory element is being read, in response to read command and address signals that are received. The circuitry 612 features voltage conditioning circuitry 614 that is coupled to the bitlines and wordlines to cause the sneak and signal charges to be released by addressed and unaddressed memory elements, in response to a read command. The circuitry 612 may also translate a received read address into pairs of bitlines and wordlines to which the memory elements that are being addressed are connected. This type of translation is also known as address decoding.

The circuitry 612 is a modified version of conventional bitline control and sense circuitry, wherein current integration circuitry 612 has been modified, according to an embodiment of the invention, to stop integration of a bitline current at a point in time which maximizes the signal to sneak ratio for the bitline. The start of the integration time may be according to any conventional technique, for instance starting integration as soon as the addressed memory element receives the full polarization voltage. This integration of the bitline current yields a total bitline charge value that is then used to determine the actual signal charge that was released by the addressed memory element in response to the full polarization voltage being applied to it. As was mentioned above, one way to describe the shortened integration interval may be one in which integration is stopped as soon as a rate of decrease of the current in the addressed bitline has been substantially reduced or a rate of change of the running total bitline charge value during integration has been substantially reduced.

The current integration circuitry 616 may be implemented using, for instance, an integrating sense amplifier coupled to integrate the bitline current under control of a programmable timer. The starting and stopping of integration may be controlled by a dedicated signal-to-sneak ratio detector and calibration circuit which adjusts the integration interval (by, for instance, setting the counter start and stop times) until a preset signal-to-sneak ratio is met by an average of a number of read operations. Another alternative is to design a circuit that can detect the rate of decrease of the addressed bitline current or the rate of change of the running total bitline charge value and then automatically halts the integration upon a threshold rate being reached. Although the waveforms in FIG. 5 are not necessarily to scale, it should be noted that the difference between the total bitline charge and the sneak charge released in the integration interval, where this difference is essentially the signal charge, may be as small as 5% of the total bitline charge. This relatively small change may generally be detected in a more reliable manner using current mode detection schemes rather than voltage mode detection.

The circuitry 612 may further include a subtraction circuit 618 to subtract a value that represents an estimate of the amount of sneak charge that was released in a bitline during an integration interval from the total bitline charge value obtained by the current integration circuit 616. This yields a measured signal charge which is then compared to a threshold charge value to determine whether the addressed memory element has changed state in response to the full polarization voltage being applied to its terminals. One way to obtain the estimate of the sneak charge is to measure only the sneak charge released by a reference column of memory elements that are connected to a reference bitline and to the wordlines in the memory device 602, while these reference elements are conditioned in the same way as the true information carrying memory elements are during a read operation. Another technique for obtaining the estimate of the released sneak charge is to run a computer aided simulation of the release of sneak charge in the particular memory device 602.

Figure 7:
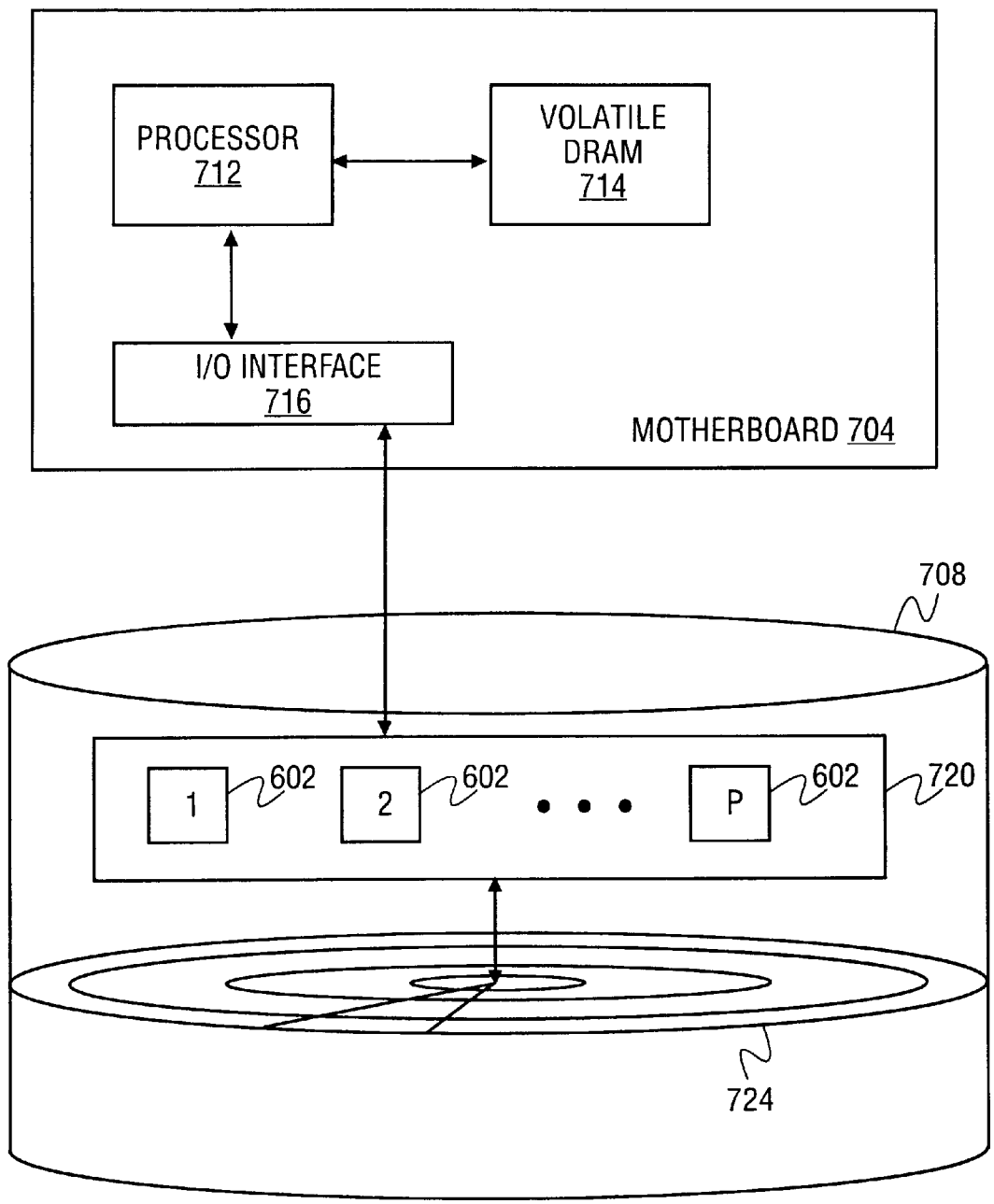
FIG. 7 shows a block diagram of an electrical system as an application of the non-volatile memory device of FIG. 6.

FIG. 7 illustrates a block diagram of a system application of a memory device 602. The system is a computer that has a motherboard 704 communicatively coupled to a rotating disk unit 708. The motherboard 704 has a processor 712 which has its instructions and data for program memory stored in a volatile dynamic random access memory (DRAM) subsystem 714. Communication between the processor 712 and the rotating disk unit 708 is via a conventional input/output (I/O) interface 716. The date to be stored in the disk unit 708 is cached in a disk cache unit 720. This unit 720 features a number P of memory devices 602 which cache the data in a non-volatile manner. The main non-volatile storage area in the disk unit 708 includes a number of rotating disks 724. The disk 724 may be magnetic and/or optical read/write media. The computer system may be a desktop or it may be a portable unit. Other system applications for the memory device 602 include replacement of non-volatile solid state units such as electrically erasable and programmable read-only memories which store the boot code of a computer system.

To summarize, various embodiments of a memory device and a method for accessing a state of a memory element in the memory device have been described which feature a shortened integration interval that helps increase the signal to sneak ratio as well as yields a faster read operation in a cross-point matrix memory array with polarizable materials. In the foregoing specification, the invention has been described with reference to specific exemplary embodiments thereof. It will, however, be evident that various modifications and changes may be made thereto without departing from the broader spirit and scope of the invention as set forth in the appended claims. For instance, the polarizable material may be a dipole ferroelectric material, a ferromagnetic material, or other material which can store information in the form of different magnetic or electric states. Also, the invention is not restricted to the ⅔–⅓ fractions of the polarization voltage that were used in the exemplary voltage conditioning methodology of FIG. 5 as other voltage levels can be substituted so long as the unaddressed memory elements are not allowed to interfere with the reading of the addressed element. The specification and drawings are, accordingly, to be regarded in an illustrative rather than a restrictive sense.

What is claimed is:

1. A memory device comprising:
    a plurality of memory elements each containing a polarizable material;
    a plurality of bitlines and a plurality of wordlines arranged in a cross-point matrix and coupled to provide access to the memory elements, an addressed one of the plurality of memory elements to release a signal charge and an unaddressed one to release a sneak charge onto an addressed one of the plurality of bitlines while the addressed memory element is being read;
    voltage conditioning circuitry coupled to the plurality of bitlines and the plurality of wordlines to cause the signal charge to be released, thereby increasing a current in the addressed bitline, in response to a read command; and
    current integration circuitry coupled to start integrating the addressed bitline current in response to the read command and to stop integrating when a signal to sneak ratio of the addressed bitline is maximum, to yield a total bitline charge value.

2. The memory device of claim 1 wherein the polarizable material is a dipole ferroelectric material.

3. The memory device of claim 1 further comprising:
    subtraction circuit coupled to subtract a value that represents an estimate of the amount of sneak charge released in a bitline during an integration interval from the total bitline charge value, to yield a measured signal charge, and compare the measured signal charge to a threshold charge value.

4. The memory device of claim 1 wherein the voltage conditioning circuitry is to apply a voltage less than a polarization voltage but greater than a static voltage between the addressed bitline and the plurality of wordlines during a first interval, which causes some of the sneak charge to be released.

5. The memory device of claim 4 wherein the integration circuitry is to integrate the addressed bitline current during a second interval immediately subsequent to the first interval.

6. The memory device of claim 5 wherein the conditioning circuitry is to further apply the polarization voltage between the addressed bitline and an addressed wordline during the second interval, which causes the signal charge to be released.

7. An electrical system comprising:
    a computer motherboard on which a processor and volatile solid state memory are installed, the motherboard having an I/O interface to which the processor is communicatively coupled; and
    a non-volatile storage device coupled to the I/O interface for access by the processor, the storage device having a rotating disk, as non-volatile mass storage media, being coupled to a cache, the cache having a non-volatile solid state memory device for storage, the non-volatile solid state memory having a plurality of memory elements each containing a polarizable material, a plurality of bitlines and a plurality of wordlines arranged in a cross-point matrix and coupled to provide access to the memory elements, an addressed one of the plurality of memory elements to release a signal charge and an unaddressed one to release a sneak charge onto an addressed one of the plurality of bitlines while the addressed memory element is being read, voltage conditioning circuitry coupled to the plurality of bitlines and the plurality of wordlines to cause the signal charge to be released, thereby increasing a current in the addressed bitline, in response to a read command, and current integration circuitry coupled to start integrating the addressed bitline current in response to the read command and to stop integrating as soon as a rate of decrease of the addressed bitline current has been substantially reduced, to yield a total bitline charge value.

8. The electrical system of claim 7 wherein the voltage conditioning circuitry is to apply a voltage less than a polarization voltage but greater than a static voltage between the addressed bitline and the plurality of wordlines during a first interval, which causes some of the sneak charge to be released.

9. The electrical system of claim 8 wherein the integration circuitry is to integrate the addressed bitline current during a second interval immediately subsequent to the first interval.

10. The electrical system of claim 9 wherein the conditioning circuitry is to further apply the polarization voltage between the addressed bitline and an addressed wordline during the second interval, which causes the signal charge to be released.

11. A method comprising:
    accessing a state of a memory element in a memory device, by conditioning a plurality of wordlines and an addressed one of a plurality of bitlines in the memory device, causing an addressed one of a plurality of memory elements in the device to release a signal charge and an unaddressed one to release a sneak charge into the addressed bitline which causes a current in the addressed bitline to increase; and
    halting integration of the current when a signal to sneak ratio of the addressed bitline is maximum, to yield a total bitline charge value.

12. The method of claim 11 wherein the accessing includes a first interval and a subsequent second interval, the conditioning includes applying a voltage less than a polarization voltage but greater than a static voltage between the addressed bitline and the plurality of wordlines during the first interval, which causes some of the sneak charge to be released.

13. The method of claim 12 wherein the integration occurs during the second interval and not the first interval.

14. The method of claim 13 wherein the conditioning further includes applying the polarization voltage between the addressed bitline and an addressed wordline during the second interval, which causes the signal charge to be released.

15. The method of claim 14 further comprising:
    subtracting a value that represents an estimate of the amount of sneak charge released in a bitline during an integration interval from the total bitline charge value, to yield a measured signal charge.

16. The method of claim 15 further comprising:
    comparing the measured signal charge to a threshold charge value.

17. A memory device comprising:

a plurality of memory elements each containing a polarizable material;

a plurality of bitlines and a plurality of wordlines arranged in a cross-point matrix and coupled to provide access to the memory elements, an addressed one of the plurality of memory elements to release a signal charge and an unaddressed one to release a sneak charge onto an addressed one of the plurality of bitlines while the addressed memory element is being read;

voltage conditioning circuitry coupled to the plurality of bitlines and the plurality of wordlines to cause the signal charge to be released, thereby increasing a current in the addressed bitline, in response to a read command; and current integration circuitry coupled to start integrating the addressed bitline current in response to the read command, to yield a running total bitline charge value, and to stop integrating as soon as a rate of change of the running total bitline charge value has been substantially reduced, to yield a total bitline charge value.

18. The memory device of claim 17 wherein the polarizable material is a ferroelectric dipole material.

19. The memory device of claim 17 further comprising:
subtraction circuit coupled to subtract a value that represents an estimate of the amount of sneak charge released in a bitline during an integration interval from the total bitline charge value, to yield a measured signal charge, and compare the measured signal charge to a threshold charge value.

20. The memory device of claim 17 wherein the voltage conditioning circuitry is to apply a voltage less than a polarization voltage but greater than a static voltage between the addressed bitline and the plurality of wordlines during a first interval, which causes some of the sneak charge to be released.

21. The memory device of claim 20 wherein the integration circuitry is to integrate the addressed bitline current during a second interval immediately subsequent to the first interval.

22. The memory device of claim 21 wherein the conditioning circuitry is to further apply the polarization voltage between the addressed bitline and an addressed wordline during the second interval, which causes the signal charge to be released.

* * * * *